United States Patent
Brueske et al.

(10) Patent No.: US 7,477,103 B2
(45) Date of Patent: Jan. 13, 2009

(54) AMPLIFIER CIRCUIT

(75) Inventors: Daniel Brueske, Sammamish, WA (US); David A. Petersen, Fall City, WA (US)

(73) Assignee: Siemens Medical Solutions USA, Inc., Malvern, PA (US)

(*) Notice: Subject to any disclaimer, the term of this patent is extended or adjusted under 35 U.S.C. 154(b) by 266 days.

(21) Appl. No.: 11/198,740

(22) Filed: Aug. 5, 2005

(65) Prior Publication Data
US 2007/0030070 A1 Feb. 8, 2007

(51) Int. Cl.
H03F 3/45 (2006.01)

(52) U.S. Cl. .................. 330/260; 330/257; 330/258

(58) Field of Classification Search .................. 330/260, 330/257, 258
See application file for complete search history.

(56) References Cited

U.S. PATENT DOCUMENTS

| | | | |
|---|---|---|---|
| 4,292,569 | A | 9/1981 | Gerry |
| 4,667,166 | A | 5/1987 | Itoh |
| 4,816,772 | A | 3/1989 | Klotz |
| 5,404,097 | A | 4/1995 | Barou |
| 5,510,738 | A | 4/1996 | Gorecki et al. |
| 5,572,166 | A | 11/1996 | Gilbert |
| 5,573,001 | A | 11/1996 | Petrofsky et al. |
| 5,952,880 | A | 9/1999 | Voorman et al. |
| 5,994,961 | A | 11/1999 | Lunn et al. |
| 5,999,053 | A | 12/1999 | Eschauzier |
| 6,078,169 | A | 6/2000 | Petersen |
| 6,172,636 | B1* | 1/2001 | Murden et al. ............... 341/155 |
| 6,639,457 | B1 | 10/2003 | Lou |
| 6,784,737 | B2* | 8/2004 | Martin et al. ............... 330/257 |
| 6,853,249 | B2* | 2/2005 | Cyrusian ................... 330/253 |
| 6,894,564 | B1 | 5/2005 | Gilbert |
| 7,075,369 | B2* | 7/2006 | Takenaka ................... 330/254 |
| 2007/0030067 | A1 | 2/2007 | Brueske |

OTHER PUBLICATIONS

Andreas Andreou and Kwabena A. Boahen, "Translinear Circuits in Subthreshold MOS," Analog Integrated Circuits and Signal Processing; vol. 9, No. 2, Mar. 1996.
B. Gilbert, "Current-Mode Circuits from a Translinear Viewpoint: a Tutorial." Chapter 2 of C. Toumazou, F. J. Lidgey and D.G. Haigh, eds., Analogue IC Design: The Current-Mode Approach, IEEE Circuits and Systems Series, vol. 2. Peter Peregrinus Ltd: London, 1990, p. 11-21.
B. Gilbert, "Translinear Circuits: A Proposed Classification," Electronic Letters, vol. 11, No. 1, Jan. 9, 1975, pp. 14-16.

* cited by examiner

Primary Examiner—Patricia Nguyen

(57) ABSTRACT

An amplifier has a voltage to current converter coupled between a first potential and a reference potential and includes a control input coupled to a voltage at an input of the amplifier for converting the voltage at the amplifier input into a corresponding output current. A current multiplier is fed by the output current for producing an increased current. The increased current is fed to a control electrode of a transistor. A feedback element provides the first potential to the voltage to current converter by coupling a voltage produced by the feedback element in response current through the transistor to the voltage to current converter.

16 Claims, 5 Drawing Sheets

AMPLIFIER CIRCUIT

REFERENCE TO RELATED APPLICATIONS

The present patent document is related to U.S. patent application Ser. No. 11/197,929 SYSTEM FOR LOGARITHMICALLY CONTROLLING MULTIPLE VARIABLE GAIN AMPLIFIERS, Daniel Brueske, which is filed concurrently with the present application, is commonly assigned with the present application, and is hereby incorporated by reference in its entirety.

TECHNICAL FIELD

This invention relates generally to amplifier circuits and more particularly to high dynamic range, variable gain, low noise amplifier circuits. Still more particularly, the invention relates to high dynamic range, variable gain, low noise amplifier circuits useful in beam forming networks and suitable for fabrication as an integrated circuit, such integrated circuit having thereon a plurality of such amplifiers and associated phase shifters to provide the beam forming network.

BACKGROUND

As is known in the art, low noise amplifiers are used in a wide range of applications. One such application is in a phased array systems having an array of transducers such as, for example, radio frequency antennas of the type used in radar systems or sonic transducers of the type used in sonar and ultrasound systems. In such phased array systems the amplifiers are included in a beam forming network. More particularly, the beam forming network includes a plurality of the low noise amplifiers, each one connected to a corresponding one of the transducers, and a plurality of phase shifters each one connected to a corresponding one of the amplifiers. A controller provides phase shifting signals to the phase shifter to provide a collimated and directed beam of energy; radio frequency energy in the case of an antenna and sound or ultrasound energy in the case of sonic transducers.

Gain control signals are provided to adjust the gain of the amplifiers, for example as a function of time after transmission of a pulse of energy to adjust for changes in the strength of a signal received by the transducers in response to such transmitted pulse, i.e., Time-Gain Compensation (TGC). In some systems, the variable gain amplifier (VGA) used by the TGC is performed using interpolative methods. These methods generally require relatively large integrated circuit die area. In addition, such method requires a relatively complex controller to generate the different levels of interpolation. Also, when passive type interpolation is used, the noise figure (NF) generally begins to degrade immediately as the gain is reduced from the TGC setting. This makes it difficult to use in a low gain, low noise mode by adjusting the TGC setting. Another type of variable gain amplifier (VGA) used to perform TGC includes current steering to a differential pair of transistors. Here, a bias current for the differential pair is steered from one of the transistors to the other one of transistors thereby causing a change in amplifier gain. While such VGA does not require a relatively complex controller, and is very efficient in its use of chip area; only one differential pair is needed. However, the output compression of the amplifier decreases with reduction in gain thereby limiting the usable dynamic range of the amplifier. While the dynamic range may be increased by using an adjustable bias for the differential pair which varies with gain, such adjustable bias increases complexity, and power requirements, of the amplifier.

SUMMARY

In accordance with the present invention, an amplifier is provided having a voltage to current converter coupled to a first potential and a control input coupled to a voltage at an input of the amplifier for converting the voltage at the amplifier input into a corresponding output current. A current multiplier is fed by the output current for producing an increased current. The increased current is fed to a control electrode of a transistors. A feedback element provides the first potential to the voltage to current converter by coupling a voltage produced by the feedback element in response to current through the transistor to the voltage to current converter.

In one embodiment, an amplifier is provided having a voltage to current converter coupled to a first potential and a control input coupled to a voltage at an input of the amplifier for converting the voltage at the amplifier input into a corresponding output current. A current multiplier is fed by the output current for producing an increased current. The increased current is fed to a control electrode of a transistor of a differential pair of transistors. A feedback element provides the first potential to the voltage to current converter by coupling a voltage produced by the feedback element in response to a current through the transistor to the voltage to current converter.

In one embodiment, the amplifier includes a second differential pair of transistors connected to the first-mentioned differential pair of transistors to form a translinear loop, such second differential pair of transistor providing a differential output current for the amplifier.

In one embodiment, the first voltage to current converter includes a field effect transistor and a gate of such field effect transistor provides the control input thereof.

In one embodiment, the feedback element is a resistive element.

In one embodiment, first and second current sources are coupled to the first-mentioned and second differential pair of transistors, respectively, the first and second current sources providing a gain control input for the amplifier with the sum of the first current source and the second current source being a constant.

In one embodiment, the amplifier includes a second voltage to current converter coupled to a second potential. The second voltage to current converter is coupled to the control electrodes of the transistors of the differential pair of transistors and converts the voltage at the control electrodes into a corresponding second output current. A second current multiplier is fed second output current for producing a second increased current at an output thereof. The feedback element provides the second potential to the second voltage to current converter by coupling a second voltage produced at the feedback element in response to current through a second transistor of the differential pair of transistors to the second voltage to current converter.

In one embodiment the amplifier includes a third differential pair of transistors connected to the first differential pair of transistors to form a dc correction loop with biasing proportional to current supplied to the first-mentioned differential pair of transistors for ensuring constant bandwidth independent of amplifier gain.

In one embodiment, the amplifier includes including a common mode bias control circuit for providing current to the first-mentioned differential pair of transistors in response to a signal at a common node of the transistors in the first-mentioned differential pair of transistors and a signal for controlling current at the common node.

DESCRIPTION OF DRAWINGS

Like reference symbols in the various drawings indicate like elements.

DETAILED DESCRIPTION

Figure 1:
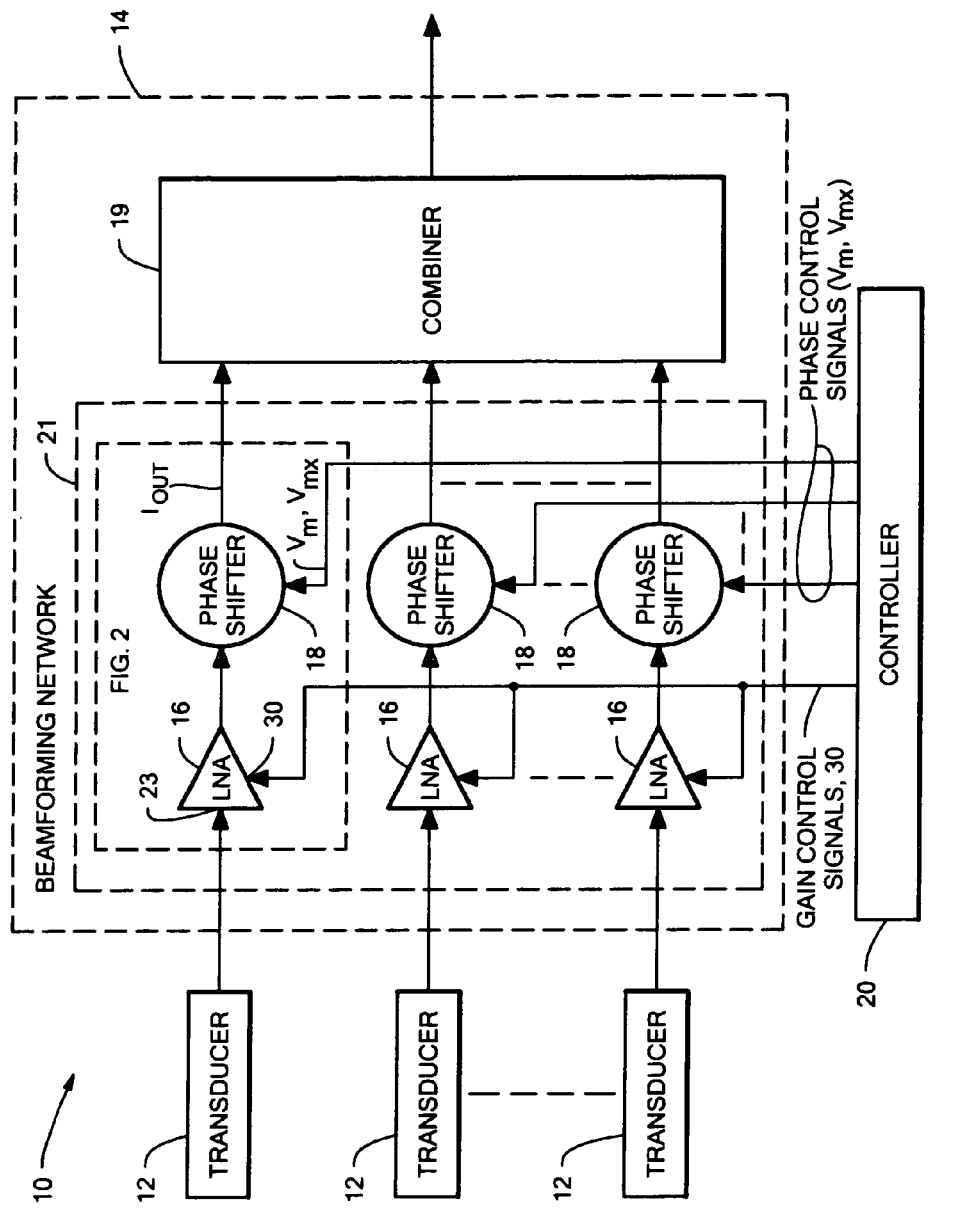
FIG. 1 is a block diagram of the front end of a phased array system including a beam forming network coupled to an array of transducers, such beam forming network having a plurality of low noise amplifiers (LNAs) and phase shifters according to the invention, feeding a combiner to produce collimated and directed beams of energy.

Referring now to FIG. 1, the front end of a phased array system 10 is shown having an array of transducers 12 fed to a receiving beam forming network 14. Here, for example, the phased array system 10 is used in an ultrasound imaging system. The beam forming network 14 includes a plurality of the low noise amplifiers 16, each one connected to a corresponding one of the transducers 12 and a plurality of phase shifters, here mixers 18, each one connected to a corresponding one of the amplifiers 16. The mixers 18 are fed to a combiner 19, as shown.

A controller 20 provides phase shifting signals to the phase shifter, here mixers 18, to provide a collimated and directed receive beam of energy. Gain control signals 30 are provided by the controller to adjust the gain of the amplifiers 16, for example as a function of time after transmission of a pulse of energy, to thereby adjust for changes in the strength of a signal received by the transducers 12 in response to such transmitted pulse, i.e., Time-Gain Compensation (TGC).

Here, the low noise amplifiers 16 and mixers 18 of at least a sub array of the system are formed on a common integrated circuit 21, here, for example, using BiCMOS processing.

Figure 2:
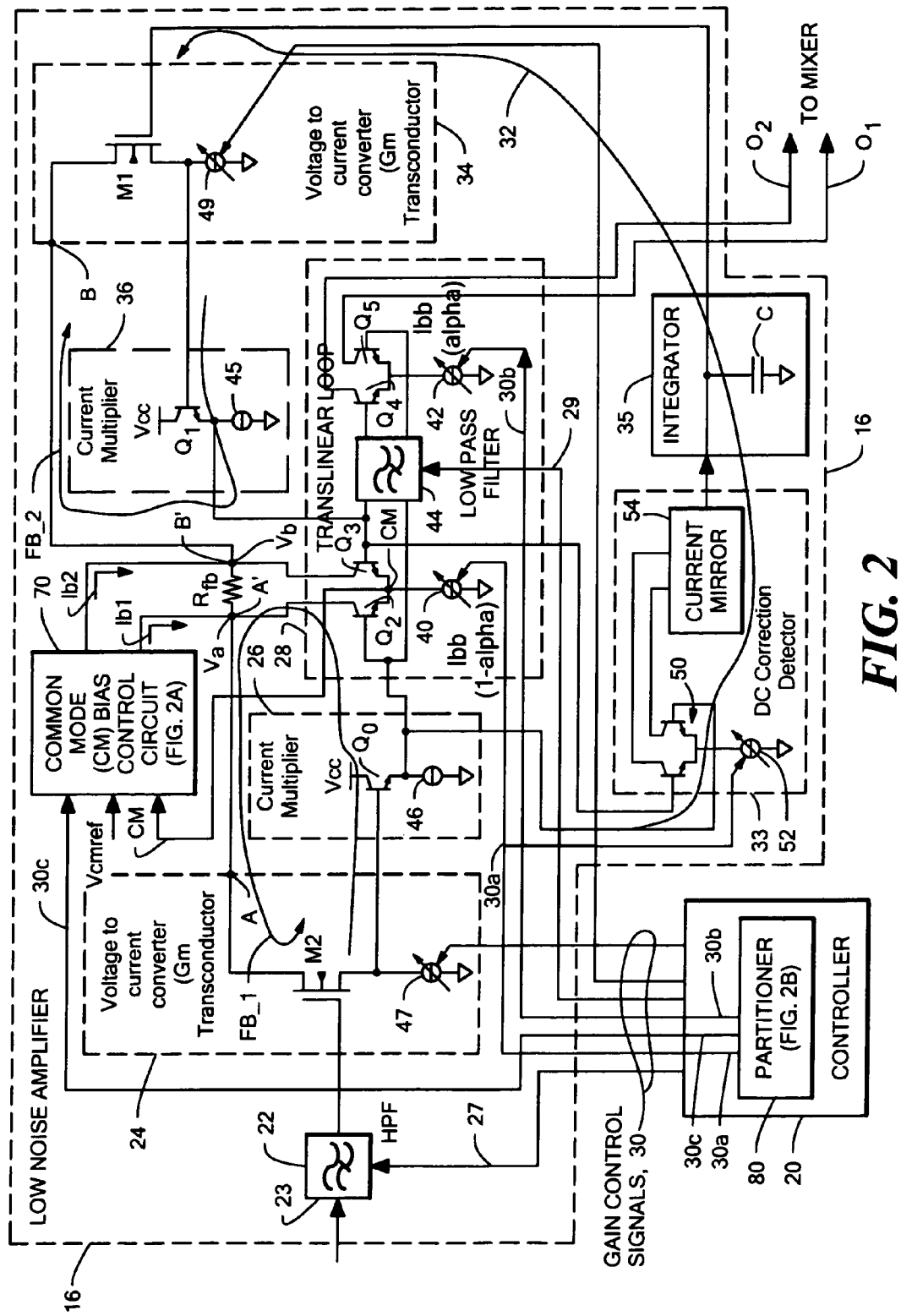
FIG. 2 is a simplified schematic diagram of an exemplary one of the low noise amplifiers used in the beam forming network in FIG. 1 according to the invention.

Referring now to FIG. 2, an exemplary one of the amplifiers is shown. The amplifier 16 includes a high pass filter 22, here an AC coupling capacitor, for example, fed by signals, here a time varying voltage, received from the coupled one of the transducers 12, FIG. 1, at input terminal 23. The voltage is converted into a corresponding current by a voltage to current converter, or $G_m$ transconductor, 24. The current is multiplied by a current multiplier 26. The multiplied current is fed to a translinear loop 28. The gain of the translinear loop 28 is controlled by the gain control signals 30 by the controller 20 (FIG. 1) and in this ultrasound application provides the TGC function. The output of the translinear loop 28 provides the output of the amplifier 16 and is here a differential current produced on lines $O_1$ and $O_2$. The differential current is proportional to the input voltage at input terminal 23 multiplied by the transconductance of the amplifier 16, $G_{m\_AMP}$. The gain of the amplifier 16 is thus controlled by the TGC signals 30 produced by the controller 20 (FIG. 1). The differential current produced on lines $O_1$ and $O_2$ is fed to the phase shifter 18 shown in FIG. 3. Also fed to the phase shifter 18 is a phase shifting signal produced by the controller 20. It is noted that here the phase shifter 18 is a mixer. Further, the phase shifting signal is a train of square waves or pulses, herein referred to as clock signals, $V_m$, $V_{mx}$, fed to the phase shifters 18 which switch or alternate in polarity and may be represented as thus switch alternatively between a+1 condition and a−1 condition. More particularly, here the phase shifting signal is a differential voltage $V_m$, $V_{mx}$ having a polarity which changes or alternates in polarity at a frequency twice that of the transmitted pulse carrier frequency. Thus, during one interval, $V_m - V_{mx}$ is positive and during the successive interval, $V_m - V_{mx}$ is negative.

Referring also to FIG. 1, it is noted that the collimated and directed beam is produced as a function of the relative phase shift across the plurality of phase shifter 18. For example, if all phase shifting signals are in phase with each other, a beam is directed along what is commonly referred to as the boresight axis, and deviations from this in phase condition causes corresponding angular deviations of the beam from boresight. Thus, the direction of the beam is, in reference to FIG. 1, a function of the relative phases of the trains of pulses fed to the phase shifters 18 by the controller 20.

Referring again to FIG. 2, as described above, the amplifier 16 includes a voltage to current converter 24. The voltage to current converter 24 is coupled between a first potential, here at terminal A and a current source 47, and includes a control input coupled to a voltage at an input of the 23 through the high pass filter 22 amplifier. The voltage to current converter 24 converts the voltage between terminal A and the amplifier input 23 into a corresponding output current. Here the voltage to current converter 24 includes a field effect transistor M2 having the gate providing the control input.

The current multiplier 26 is fed by the output current for producing an increased current at an output thereof. Here the current multiplier is a bipolar transistor $Q_0$ having the base electrode connected to the output of the voltage to current converter 24, a collector coupled to Vcc, and an emitter connected to a current source 46 and to the translinear loop 28, as shown. Thus, the transistor $Q_0$ multiplies the current at its base electrode, i.e., the current produced at the output of the voltage to current converter 24, by the beta ($\beta$) of transistor $Q_0$, typically by a factor of 100.

The translinear loop 28 includes a differential pair of transistors, here bipolar transistors $Q_2$, $Q_3$. The increased current produced by the current multiplier 26 is fed to a control electrode, here the base electrode, of transistor $Q_2$. More particularly, the transistors $Q_2$ through $Q_5$ are arranged in two pairs. A first pair of bipolar transistors, here $Q_2$ and $Q_3$ have the emitters thereof connected to a first, here variable, current source 40. A second pair of bipolar transistors, here $Q_4$ and $Q_5$ have the emitters thereof connected to a second, here variable, current source 42. The transistors $Q_2$, $Q_3$, $Q_4$, $Q_5$, are here matched bipolar transistors. The base of each of the bipolar transistors $Q_2$ and $Q_3$ is coupled to a base of a corresponding one of the bipolar transistors $Q_5$ and $Q_4$, respectively, through an optional low pass filter 44, as shown. This arrangement forms the translinear loop 28. The current produced by current sources 40, 42 is controlled by the control signals 30.

The amplifier includes a second voltage to current converter 34 or $G_m$ transconductor, coupled between a second potential, here at terminal B, and the current source 49.

The amplifier 16 includes a DC correction loop 32. More particularly, the DC correction loop 32 includes a differential pair of transistors 50 coupled to the bases of Q2 and Q3 with an output connected to current mirror 54. More particularly, the DC correction loop 32 includes a second differential pair of transistors 50 for detecting a DC error signal at control electrodes, here base electrodes, of the first pair of differential transistors $Q_2$, $Q_3$.

The current mirror 54 output is coupled to the second voltage to current converter 34 through an integrator 35.

More particularly, the second voltage to current converter 34 is coupled between a second potential, here at terminal B and current source 49, and includes a control input coupled to voltage at the base electrodes of transistor $Q_4$ and $Q_3$ through integrator 35. The second voltage to current converter 34 converts the voltage between terminal B and the input to the voltage to current converter 34 into a corresponding output current. Here the voltage to current converter 34 includes a field effect transistor M1 having the gate providing the control input. The transistors M1 and M2 are matched Metal Oxide Semiconductor Field Effect Transistors. This second output current produced by the second voltage to current converter 34 is fed to a second current multiplier 36 for producing a second increased current at an output thereof. Here the second current multiplier 36 is a bipolar transistor $Q_1$ having the base electrode connected to the output of the voltage to current converter 34, a collector coupled to Vcc, and a base connected to ground through a current source 45 and to the translinear loop 28, as shown. Thus, the transistor $Q_1$ multiplies the current at its base electrode, i.e., the current produced at the output of the voltage to current converter 34, by the beta of transistor $Q_1$, typically by a factor of 100.

A feedback element, here a resistor $R_{fb}$ has: (1) a first terminal, or electrode A' providing the first voltage (i.e., potential), $V_a$, to the terminal A of the voltage to current converter 24 by coupling the first voltage, $V_a$, produced at the first terminal A of the feedback element $R_{fb}$, in response to current through transistor $Q_2$ in a first feedback loop, FB_1 and, (2) a second terminal or electrode B' providing the second potential, $V_b$, produced at the second terminal B of the second voltage to current converter 34 by coupling the second voltage, $V_b$, produced at the second terminal B of the feedback element $R_{fb}$ in response to current through transistor Q3 in a second feedback loop, FB_2. Thus, the collector electrode of transistor $Q_2$ is connected to: (1) the terminal A of voltage to current converter 24; (2) a current source Ib1; and, (3) electrode A' of resistor $R_{fb}$, as shown and the collector electrode of transistor $Q_3$ is connected to: (1) the terminal B of voltage to current converter 34; (2) a current source Ib2; and, (3) electrode B' of resistor $R_{fb}$, as shown.

First and second adjustable current sources 40, 42 are coupled to the differential pairs of transistors, $Q_2$, $Q_3$ and $Q_4$, $Q_5$, respectively, as shown. The first and second adjustable current sources 40, 42 are controlled by control signals 30 to adjust the gain of the amplifier 16. More particularly, the current produced by current source 40 is $I_{bb}(1-\alpha)$ and the current produced by current source 42 is $I_{bb}(\alpha)$. The gain of the amplifier 16 is proportional to $(\alpha)/(1-\alpha)$; i.e., the ratio of the differential current in lines $O_1$ and $O_2$ to the voltage at amplifier input terminal 23 is $(\alpha)/(1-\alpha)$. It is noted that the sum of the current sources 40, 42 is $I_{bb}$, a constant.

As described above, the amplifier 16 is able to dynamically adjust the input and output compliance operating points in accordance with the TGC signal. The bias currents of sources 40 and 42 are changed dynamically via the TGC signals by some external arbitrary controller of a parameter, here controller 20 (FIG. 1). That is, the bias is shifted within the translinear loop 28 by adjusting currents of sources 40 and 42 through the α parameter, i.e., through the control signals 30a, 30b, respectively of the control signals 30 produced by the controller 20, more particularly by a partitioner 80 in the controller 20. The details of partitioner 80 will be described in more detail in connection with FIG. 2B.

As the input signal level at input 23 becomes smaller, lower clip points are needed but more amplifier gain is required. The dynamic bias adjustment of the current sources 40, 42 reduces the input signal clip point at 23 while simultaneously increasing the output clip point and sets the configuration of the current in the translinear loop 28 to increase the gain of the translinear loop 28.

As noted above, the amplifier 16 includes a feedback element, here a resistor $R_{fb}$. The feedback resistor $R_{fb}$ determines the nominal transconductance of the amplifier 16, $G_{m\_AMP}$. When the control signal 30 is at its nominal value the gain in the translinear loop 28 is such that the transconductance, $G_{m\_AMP}$, is exactly equal to the inverse of $R_{fb}$. This is the case when α is equal to one half. When the control signal 30 is at any other value the transconductance, $G_{m\_AMP}$, will vary. This can vary in many ways but in general as α increases the transconductance, $G_{m\_AMP}$, will increase and will decrease for decreasing α. Thus the transconductance $G_{m\_AMP}$ is proportional to $R_{fb}$ where the proportionality constant is determined by the amplifier gain set within the translinear loop 28 by the control signals 30.

Basically the feedback resistor $R_{fb}$ determines the nominal $G_{m\_AMP}$ or transconductance of the amplifier 16. The feedback caused by the resistor $R_{fb}$ makes the gain of the amplifier 16 approximately equal to the value $$G_{m\_AMP} = \frac{\frac{\beta \cdot gm_2 \cdot G_m}{gm_0}}{1 + \frac{\beta \cdot gm_2 \cdot G_m}{gm_0} R_{fb}} \cdot \frac{\alpha}{1-\alpha} \approx \frac{1}{R_{fb}} \cdot \frac{\alpha}{1-\alpha}$$

where:

$G_m$ is the transconductance of voltage to current converter 24;

is the ratio of emitter current to base current in transistor $Q_0$;

$R_{fb}$ is the resistance of resistor $R_{fb}$;

$gm_2$ is the transconductance of transistor $Q_2$;

$gm_0$ is the transconductance of transistor $Q_0$; and $$\frac{\beta \cdot gm_2 \cdot G_m}{gm_0} R_{fb}$$

is the open loop gain formed by the voltage to current converter 24, current multiplier 26 and input differential pair of transistors Q2 and Q3. i.e., the open loop gain of feedback loop FB_1 in FIG. 2. The FB_2 loop has a similar open loop gain but it is assumed to be equal to the gain in FB_1 for this analysis.

The amplifier 16 has several adjustable parameters to facilitate different ultrasonic modes. The variables are:

the currents from current sources 47 and 49 set the bias of the preamp (i.e., noise figure (NF) Control);

the current reference $I_{bb}$ from current sources 40 and 42 and are controlled by the control signals 30. $I_{bb}$ sets the large-signal behavior of the amplifier 16 (i.e., gain, Distortion Control, etc.); and the feedback resistor values $R_{fb}$.

These operate in conjunction with currents from current sources 47 and 49 to influence NF and the current from current source 40 to influence clipping or input compression point.

The TGC control parameter α controls dynamically the currents of current sources 40, 42 and 52. It is done in such a way as to keep the total current approximately constant; here $I_{bb}$.

The amplifier 16 has low third order intermodulation over the entire TGC range. The input compression point decreases with increasing amplifier 16 gain but third order intermodulation remains relatively constant. The amplifier 16 linearity comes from the large level of feedback through $Q_2$ and $Q_3$. But as the bias changes through these devices via current 40, the open loop gain $$\frac{\beta \cdot gm_2 \cdot G_m}{gm_0} R_{fb}$$

is reduced because gm2 decreases. But the open loop gain is sufficiently high such that the linearity can be achieved even when there is a reduced level of this open loop gain. Thus, the open loop gain must be sufficiently high so that any reduction to it caused by gain adjustments through the translinear loop 28 does not significantly increase the third order intermodulation distortion. High loop gain is achieved as a result of $Q_0$ and $Q_1$. By using the β multipliers ($Q_0$ and $Q_1$) the feedback is very large and also provides a low impedance to the translinear loop 28 so that there are minimal bandwidth limitations to the open loop gain. The translinear loop 28 gain is simply given by the ratio of the currents of current source 42 to the current of current source 40. This adjusts the transconductance or $G_{m\_AMP}$ of the amplifier 16. The controller 20 (FIG. 1) is used to manipulate the currents of current source 42 and the current of current source 40. This can be an arbitrary control function, but in this case it's generally following a dB per volt slope.

The high pass filter (HPF) 22 has discrete programmable 3 dB cutoff frequencies which are nominally set by switched resistors and capacitors, not shown.

The low pass filter (LPF) 44 has discrete programmable 3 dB cutoff frequencies which are nominally set by switched resistors and capacitors, not shown.

The discrete programmable frequencies for HPF 22 and LPF 44 are selected by logical control signals 27 and 29, respectively, such signals being part of the control signals 30 supplied by controller 20, FIG. 1.

Component variations cause offsets within the amplifier 16 and at high gains the offset could potentially limit the output dynamic range as well as increase the mixer's clock signals, $V_m, V_{mx}$, feedthrough. Thus, its essential to cancel this offset using DC offset correction. This offset correction is unique because the gain of the DC loop is varied to keep the open loop unity gain frequency the same. This is important because the DC loop 32 (FIG. 2) creates a high pass response to the incoming signal. Thus the gain of loop 32 is made constant in the dynamic biasing scheme to minimize its impact on the received signal spectrum. It is noted that the DC correction loop 32 comprises a DC correction detector 33, integrator 35, the voltage to current converter 34 and the current multiplier 36. The DC correction loop 32 is provided to compensate for component variations that may cause offsets within the amplifier 16. Further, at high gains, these offsets could potentially limit the output dynamic range as well as increase the feedthrough of the mixer's, i.e., phase shifter's 18 clock signal, $V_m, V_{mx}$. Thus, its essential to cancel this offset using the DC offset correction provided by DC correction loop 32.

The DC correction loop 32, described briefly above, includes the current multiplier 36, here the bipolar transistor $Q_1$ having the base coupled to the bases of transistor $Q_4$ and $Q_3$ through the voltage to current converter 34 the integrator 35, and a DC correction detector 33. This arrangement provides DC correction as described above. It is here noted that the emitter of transistor $Q_1$ is connected to the base of transistor $Q_3$ and to the base of $Q_4$ via the LPF 44, and to a current source 45 and the base of transistor $Q_1$ is connected to the output of the voltage to current converter 34 and to a current source 49, as shown.

Thus, the DC correction loop 32 cancels DC offsets within the amplifier 16. The DC correction loop 32 transconductance varies with the bias provided to the emitter electrodes of bipolar transistors $Q_2$ and $Q_3$ through current source 40 to maintain a constant DC correction loop 32 bandwidth. The power dissipated by the DC correction loop 32 is minimal because the current source 52 is a scaled-down replica of the current source 40 so any variations add little to the overall power dissipation of the amplifier 16.

More particularly, the DC correction detector 33 includes a bipolar transistor differential pair 50 having bases connected to the bases of transistors $Q_2$ and $Q_3$, respectively, as shown and emitters connected to a current source 52, as shown. A current mirror 54 converts the outputs at the collectors of the differential pair 50 into a single ended output which feeds the integrator 35. The integrator 35 includes a capacitor, C, connected between the output of the current mirror 54 and ground in a conventional manner. The transconductance $G_{m\_DC}$ of the differential pair 50 is controlled by the current source 52 which thereby varies the DC correction loop 32 (FIG. 2) gain. The DC correction loop 32 bandwidth is made constant by changing $G_{m\_DC}$ such that the changes in gm2 and gm3 (transconductance of Q2 and Q3 respectively) divided by $G_{m\_DC}$ is constant. This is simply done by making the changes in current source 52 proportional to the changes in current 40. This is done to prevent the amplifier's input signal high pass response, which is generated partially by the DC correction loop 32, from changing its cutoff frequency. It is noted that the unity gain bandwidth of the DC correction loop 32 is significantly less (i.e. at least an order of magnitude less) than the unity gain bandwidth of feedback loops FB_1 and FB_2 to insure stability.

The HPF (high pass filter) 22 is, as noted above, used to filter out low frequencies and block DC, as from the transmit pulse, not shown, to the transducers 12 (FIG. 1). This DC blockage is necessary when cascading stages.

The LPF (low pass filter) 44 (FIG. 2) improves the noise when the mixer 18 (FIG. 3) is activated. Mixing causes aliasing of the noise. The LPF 44 removes the noise at the aliasing frequencies and thus reduces the amount of added noise seen at the output. This helps prevent the NF (noise figure) from significant degradation.

In addition to the linearity and dynamic biasing, the dynamic range can be set either at the high end (clip point) or low end (noise level) independently. Different levels of dynamic range can be achieved by setting different static bias points set through $I_{bb}$.

Figure 2A:
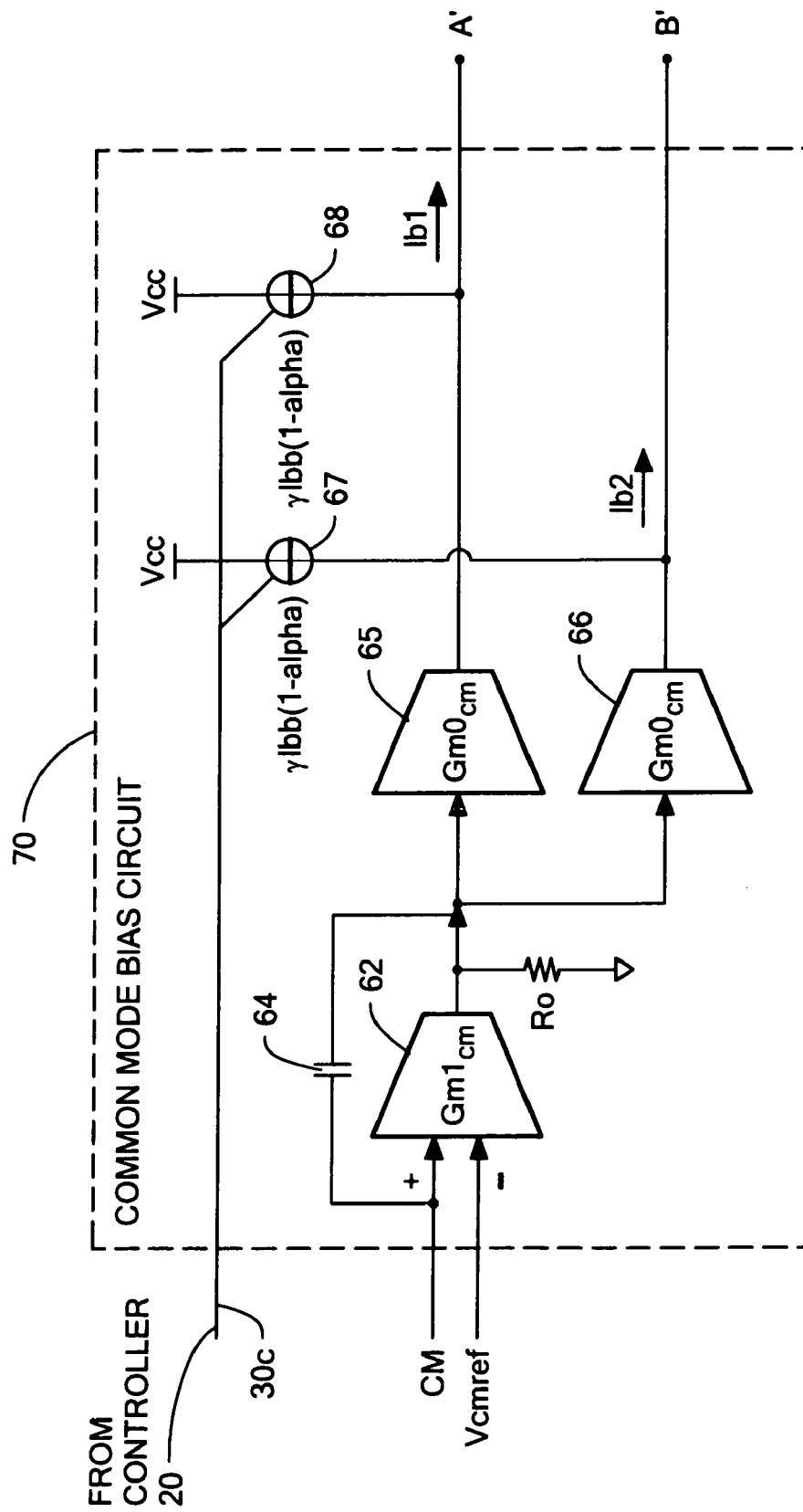
FIG. 2A is a schematic diagram of a common mode bias control circuit used in the amplifier of FIG. 2.

The amplifier 16 includes a common mode loop bias control circuit 70. The common mode circuit is shown in more detail in FIG. 2A. The common mode loop bias control circuit 70 responds to a common mode bias signal CM produced at the common node CM at the common emitter junction of transistors $Q_2$ and $Q_3$ (FIG. 2) and a common mode reference voltage Vcmref to control the current bias signals Ib1 and Ib2 at terminals A' and B', respectively, of $R_{fb}$ (FIG. 2). The current bias signals Ib1 and Ib2 are generated as follows. Current source 40 (i.e., Ibb(1−α)) is partially replicated in current sources 67 and 68 in FIG. 2A using control signal 30c. As will be described, control signal 30c is one of the control signals produced by the controller 20, more particularly by a partitioner 80 in the controller 20. The details of partitioner 80 will be described in more detail in connection with FIG. 2B.

The factor α is controlled by control signals 30 from controller 20, FIG. 1. The proportion replicated is given as γ times the original current Ibb(1−α)), where γ is nominally one-half but can be adjusted to compensate for bias control topologies. Thus the current produced by the current sources 67 and 68 is γIbb(1−α)). In order to properly bias the circuitry within the amplifier, the voltage at CM node must be high enough above ground to make current source 40 functional. Therefore, the current produced at the output of the common mode bias circuit 70, i.e., the currents Ib1 and Ib2 into the terminal A' and B'; respectively, must be sufficient to cause the appropriate bias voltage at node CM. It is noted that Ib1+Ib2=Ibb(1−α)). Further, value of γ is selected so that current sources 65, 66 maintain their ability to source and/or sink current over their current output operating range. γ is thus selected to offset any process variations and/or systematic offsets which may occur in the design. It is also noted that the resistor $R_{fb}$ can be made up of two series resistors each $R_{fb}/2$ and having a junction connecting them with the sum of Ibb1 and Ibb2 being injected into the junction.

A transconductor 62, i.e., a voltage to current converter having a Miller effect capacitor 64, is fed the voltage at the common mode node CM and a reference voltage Vcmref. The current produced by the transconductor 62 is a function of the difference between the voltage at the common node CM and the reference voltage Vcmref. The current produced at the output of transconductor 62 producers a voltage across resistor Ro. This voltage is converted into corresponding equal currents Ib1, Ib2 by pair of transconductors 65 and 66, respectively. Thus, the pair of transconductors 65 and 66 are controlled by the output of transconductor 62 (i.e., by the difference between the voltage at the common node CM and the reference voltage Vcmref, so that the currents from Ib1 and Ib2 into the terminal A' and B', respectively, are exactly enough to bias the amplifier to the desired level set by Vcmref. Thus, a common mode loop is formed from node CM, through the adjusted currents Ib1 and Ib2, and then amplified back to the CM node. The common mode loop bias circuit 70 maintains the bias at CM to the bias established by the reference voltage Vcmref. It is noted that the current produced by each one of the transconductors 65 and 66 will be equal to γIbb(1−α), where γ is, as noted above, nominally ½. In this embodiment γ is made less than ½ so that a source only transconductor is needed such as a PMOS transistor. But those skilled in the art can configure γ and transconductors either to sink, source or both.

Figure 2B:
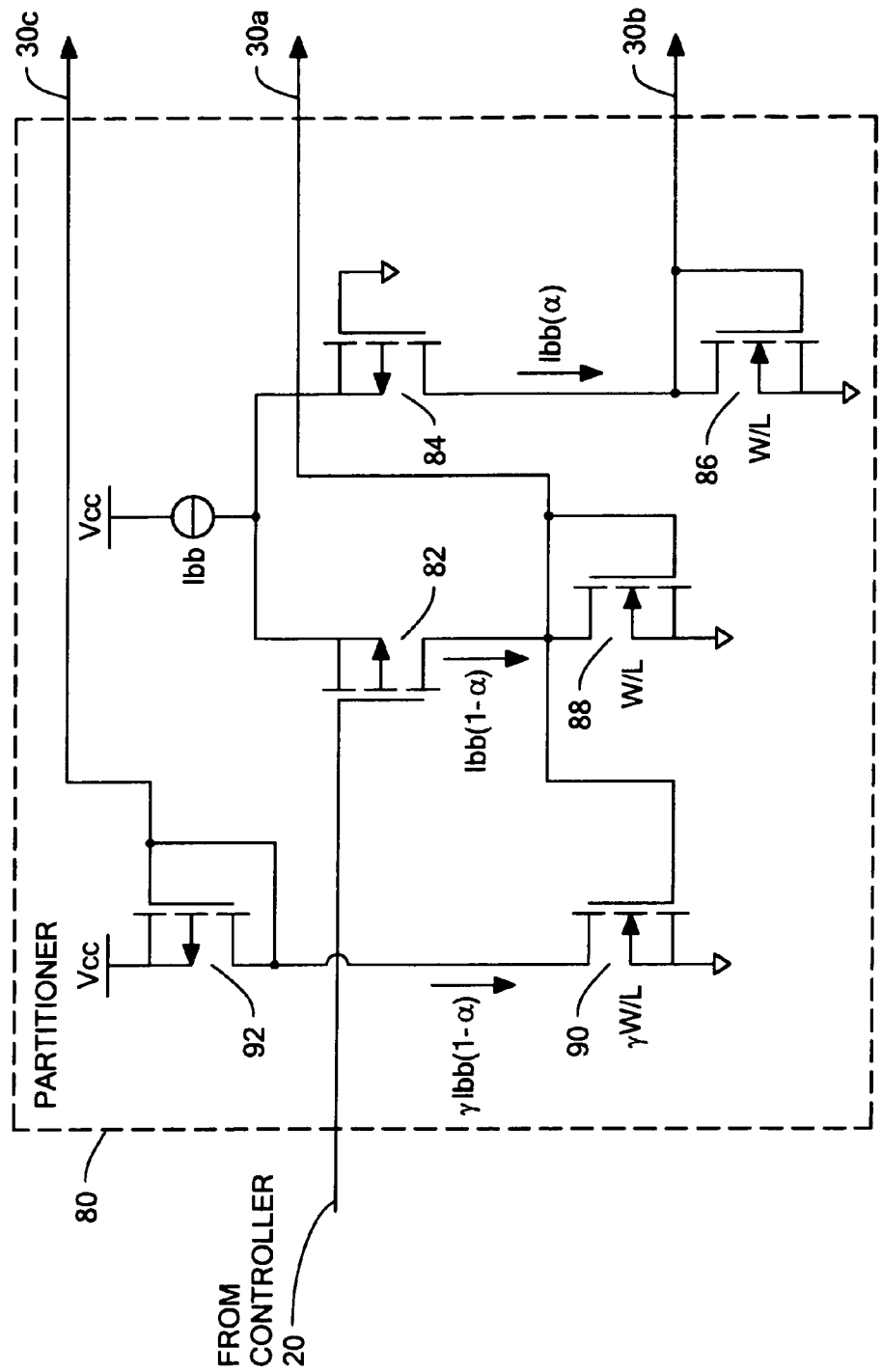
FIG. 2B is a current partitioner included in a controller of the beam forming network of FIG. 1 for controlling low noise amplifier of FIG. 2.

Referring now to FIG. 2B the current partitioner 80 is shown. The current partitioner 80 provides the signals 30a, 30b and 30c, such signals being voltages proportional to Ibb(1−α), Ibb(α), and γIbb(1−α), respectively. It is noted that the current produced by current source 40 is also proportional to Ibb(1−α) and hence is also controlled by the signal 30a to maintain constant bandwidth; however, it could vary or stay constant depending upon the implementation desired. Thus, as noted above, the signal 30a controls current sources 40 and 52; signal 30b controls current source 42, and signal 30c controls current sources 67 and 68.

More particularly, the partitioner 80 includes a differential pair of transistors 82, 84. The gate of transistor 84 is at a fixed reference potential. The gate of transistor 20 is controlled by the controller 20. The drains of the transistors 82, 84 are fed by a common current, Ibb. The drains of transistors 82, 84 are connected to diode-connected MOS field effect transistors 88, 86, respectively. The transistors 86, 88 have the same gate width (W) to gate length (L) ratio, W/L. Hence, the voltage for the signal 30a will be proportional to Ibb(1−α), and the voltage for the signal 30b will be proportional to Ibb(α). A transistor 90, having a gate also connected to the drain of transistor 88, has a gate width (W) to gate length (L) ratio equal to γW/L. Thus, the voltages for the signal 30c produced by diode-connected MOS field effect transistors 92 will be proportional to γIbb(1−α).

Figure 3:
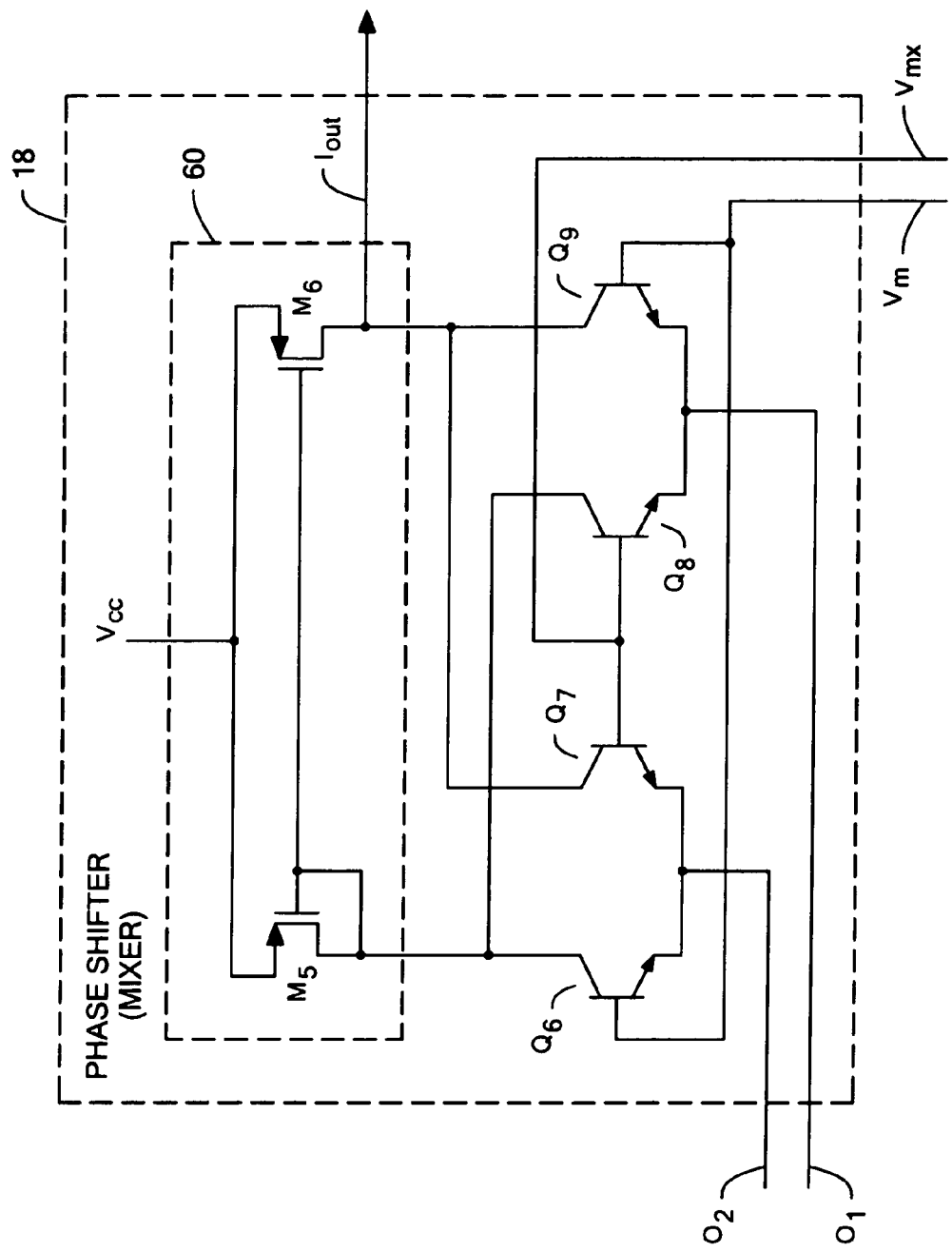
FIG. 3 is a schematic diagram of an exemplary one of the phase shifters used in the beam forming network of FIG. 1.

The mixer 18 is shown in more detail in FIG. 3 to include a first differential pair of transistors $Q_6$, $Q_7$ having: input electrodes, here emitters, coupled to a collector of transistor $Q_4$ (FIG. 3) via line $O_2$ and a control electrode, here base, of the transistor $Q_6$ is coupled to a first input of the mixer 18 at a first input terminal, $V_m$. The mixer 18 includes a second differential pair of transistors $Q_8$ and $Q_9$ having input electrodes, here emitters, coupled to a collector of transistor $Q_5$ (FIG. 3) via line $O_1$ and a control electrode, here base, coupled to a second input terminal, $V_{mx}$, of the mixer 18. The collectors of transistors $Q_6$ $Q_7$, $Q_8$ and $Q_9$ are connected to a current mirror 60 to convert the differential output of the pair of differential pair to a single output $I_{out}$. Thus, here the current mirror 60 includes a pair of MOS field effect transistors (FETs) $M_5$ and $M_6$. The MOS FET $M_5$ is connected as a diode between a voltage source $V_{cc}$ and the collectors of transistors $Q_6$ and $Q_8$. The drain of MOSFET M6 is connected to the collectors of Q7 and Q9. The gates of FETs $M_5$ and $M_6$ are connected together, as shown. The mixer's clock signals, $V_m$, $V_{mx}$ are fed to terminals $V_m$ and $V_{mx}$, respectively.

A number of embodiments of the invention have been described. Nevertheless, it will be understood that various modifications may be made without departing from the spirit and scope of the invention. For example, the complimentary operation of this device could also be used if PNP transistors are available in the process. In addition, the input devices could be exchanged for bipolar transistors. Basically, all devices could be replaced with its compliment and/or a bipolar/MOS exchange. Thus, the term control electrode used above refers to a gate electrode in the case of a FET and refers to the base of a bipolar transistor. Accordingly, other embodiments are within the scope of the following claims.

What is claimed is:

1. An amplifier, comprising:
   a voltage to current converter having a first terminal coupled to a first potential and having a control input coupled to a voltage at an input of the amplifier, for converting the voltage at the amplifier input into a corresponding output current;
   a current multiplier fed by the output current of the converter for producing an increased current at an output of the current multiplier;
   a transistor in an translinear loop, a gain of the translinear loop operable to be adjusted by a control signal for time-gain compensation;
   wherein the increased current is fed to a control electrode of the transistor; and
   a feedback element for providing the first potential to the voltage to current converter by coupling a voltage produced at the feedback element in response to current through the transistor.

2. An amplifier, comprising:
   a voltage to current converter having a first terminal coupled to a first potential and having a control input coupled to a voltage at an input of the amplifier, for converting the voltage at the amplifier input into a corresponding output current;

a current multiplier fed by the output current of the converter for producing an increased current at an output of the current multiplier;

a differential pair of transistors;

wherein the increased current is fed to a control electrode of a first one of the transistors of the differential pair of transistors; and a feedback element for providing the first potential to the voltage to current converter by coupling a voltage produced at the feedback element in response to current through the first one of the transistors of the differential pair of transistors to the voltage to current converter.

3. The amplifier recited in claim 2 including a DC correction loop, comprising:

a second differential pair of transistors for detecting a DC error signal at control electrodes of the first mentioned differential pair of transistors;

an integrator for integrating the DC error signal; and a second voltage to current converter connected to an output of the integrator for producing corresponding current, such current being feedback to the control electrode of one of the transistors in the first mentioned differential pair of transistors.

4. The amplifier recited in claim 2 including:

a second voltage to current converter having a first terminal coupled to a second potential, the second voltage to current converter being coupled to the control electrodes of the transistors of the differential pair of transistors for converting the voltage at the control electrodes of the transistors of the differential pair of transistors into a corresponding second output current;

a second current multiplier fed by the second output current for producing a second increased current at an output thereof;

wherein the feedback element provides the second potential to the second voltage to current converter by coupling a second voltage produced at the second terminal of the feedback element in response to current through the second one of the differential pair of transistors to the second voltage to current converter.

5. The amplifier recited in claim 2 wherein the amplifier includes a second differential pair of transistors connected to the first-mentioned differential pair of transistors to form a translinear loop, such second differential pair of transistor providing a differential output current for the amplifier.

6. The amplifier recited in claim 2 wherein the first-mentioned voltage to current converter includes a field effect transistor and a gate of such field effect transistor provides the control input thereof.

7. The amplifier recited in claim 2 wherein the feedback element is a resistive element.

8. The amplifier recited in claim 5 including first and second current sources coupled to the first-mentioned and second differential pair of transistors, respectively, the first and second current sources providing a gain control input for the amplifier with the sum of the first current source and the second current source being a constant.

9. The amplifier recited in claim 8 wherein the first and second current sources are adjustable current sources.

10. The amplifier recited in claim 9 including an additional current source for feeding current to the feedback element.

11. The amplifier recited in claim 10 wherein the additional current source is a controllable current source.

12. The amplifier recited in claim 11 wherein the additional current source is connected to a common electrode of the transistors in the first mentioned differential pair of transistors.

13. The amplifier recited in claim 1 wherein the current multiplier includes a bipolar transistor having a base connected to the output of the voltage to current converter and an emitter connected to the first-mentioned transistor.

14. A circuit, comprising:

(A) an amplifier, comprising:

a first voltage to current converter having a first terminal coupled to a first potential and having a control input coupled to a voltage at an input of the amplifier, for converting the voltage at the amplifier input into a corresponding output current;

a first current multiplier fed by the output current for producing an increased current at an output thereof;

a first differential pair of transistors;

wherein the increased current is fed to a control electrode of a first one of the transistors of the differential pair of transistors;

a feedback element for providing the first potential to the voltage to current converter by coupling a voltage produced at the feedback element in response to current through the first one of the transistors of the differential pair of transistors to the voltage to current converter;

a second voltage to current converter having a first terminal coupled to a second potential, the second voltage to current converter being coupled to the control electrodes of the transistors of the differential pair of transistors for converting the voltage at the control electrodes into a corresponding second output current;

a second current multiplier fed by the second output current for producing a second increased current at an output thereof;

wherein the feedback element provides the second potential to the second voltage to current converter by coupling a second voltage produced at the second terminal of the feedback element in response to current through the second one of the differential pair of transistors to the second voltage to current converter; and a second differential pair of transistors connected to the first-mentioned differential pair of transistors to form a translinear loop, such second differential pair of transistor providing a differential output current for the amplifier; and (B) a mixer having an input fed by the differential output current for the amplifier.

15. The amplifier recited in claim 5 including a third differential pair of transistors connected to the first differential pair of transistors to form a dc correction loop with biasing proportional to current supplied to the first-mentioned differential pair of transistors for ensuring constant bandwidth independent of amplifier gain.

16. The amplifier recited in claim 2 including a common mode bias control circuit for providing current to the differential pair of transistors in response to a signal at a common node of the transistors in the differential pair of transistors and a signal for controlling current at the common node.

* * * * *